United States Patent [19]

Miller, Jr. et al.

[11] 4,016,492
[45] Apr. 5, 1977

[54] PULSE DISCRIMINATOR AND MISPROBE DETECTOR FOR DIGITAL LOGIC TESTER PROBE

[75] Inventors: Edward C. Miller, Jr., Saratoga; William J. Haydamack, San Jose, both of Calif.

[73] Assignee: Hewlett-Packard Company, Palo Alto, Calif.

[22] Filed: June 9, 1975

[21] Appl. No.: 585,423

[52] U.S. Cl. .............................. 324/128; 324/72.5; 324/158 P
[51] Int. Cl.² .................. G01R 15/00; G01R 1/06
[58] Field of Search ............ 324/158 P, 72.5, 149, 324/51, 103 P, 73 R, 128; 307/234; 328/165, 167

[56] References Cited
UNITED STATES PATENTS

| | | | |
|---|---|---|---|
| 3,500,369 | 3/1970 | Kellam, Jr. | 307/234 |
| 3,753,109 | 8/1973 | Schainbaum | 324/103 P |

Primary Examiner—Rudolph V. Rolinec
Assistant Examiner—Ernest F. Karlsen
Attorney, Agent, or Firm—F. D. LaRiviere

[57] ABSTRACT

The logic circuit tester probe system described herein incorporates noise filter and data discrimination capability by comparing the duration of pulses received with the duration of the output of a one-shot. The probe system also incorporates misprobe detection capability which alerts the user that his probe is not making electrical contact with the circuit node under test whenever the input of the probe assumes the magnitude of a reference voltage rather than the magnitude of the voltage at the circuit node.

12 Claims, 4 Drawing Figures

PULSE DISCRIMINATOR AND MISPROBE DETECTOR FOR DIGITAL LOGIC TESTER PROBE

BACKGROUND AND SUMMARY OF THE INVENTION

The complexity of present day logic circuits, for example those used in modern computer systems, has made trouble shooting of a malfunctioning circuit a formidable task. Isolating faults without the aid of interactive logic circuit testers, for example backtracing with a conventional oscilloscope, can consume an extraordinary number of man-hours and contribute to excessive computer system downtime.

Logic circuit testers typically include a probe of convenient size and weight for the user to make contact with various points on the circuit board under test. The circuit node to which the probe is directed is determined by the user by referring to a circuit diagram or may be determined by referring to the readout of a computer which analyzes the responses at the preceding node to determine where the probe should next be connected. Because of the switching speeds of modern logic circuitry, such probes must have a very high frequency response. They are, therefore, sensitive to high frequency noise which, if allowed to enter the tester system, may provide the user with misleading test results. One simple solution to avoid the effects of high frequency noise is to insert a series low pass filter to remove such noise. However, such filters affect the system response to high frequency data as well, being unable to discriminate between high frequency noise and high frequency data. The preferred embodiment of the present invention, therefore, incorporates pulse discriminating circuitry which rejects all pulses of width less than a predetermined time and accepts all pulses of widths greater than that predetermined time, irrespective of amplitude.

The pulse discriminator circuit comprises two paths, one for negative going and the other for positive going input pulses. Each circuit path accepts the input signal, whether data or noise, which simultaneously is applied to a one-shot multivibrator (one-shot) and to a time delay circuit in parallel with the one-shot, the outputs of which are applied to the inputs of a NAND gate. The NAND gate inhibits further signal processing unless the signals that are applied to its inputs are coincident. The output of the NAND gate is applied to the input of a flip-flop which is clocked by the output of the one-shot. The output of the flip-flop and the output of a corresponding flip-flop of the other path is applied to an output NAND gate. The output of the output NAND gate will not respond to input pulses of duration shorter than the predetermined time unless both flip-flops are set.

A logic tester system can also receive noise pulses when the probe used to contact a circuit node is not actually making adequate electrical contact with that node. Since the noise pulses received during misprobe contact with a node could exceed the predetermined width, misleading test results could again be produced and a good board could be rejected, a bad board accepted or the board may have to be retested. Misprobe contacts commonly occur when testing boards have oxidized conformal coating or other clear dielectric coatings covering the circuitry. To reduce the amount of retest necessary by assuring that adequate electrical contact is made, the preferred embodiment of the present invention incorporates a misprobe detection capability which detects an open circuit at the probe tip. The misprobe detection capability comprises a high impedance operational amplifier for receiving the output or the probe and comparing it to a reference voltage. The output of the operational amplifier is then applied to one input of a dual comparator circuit and the reference voltage is applied to the other input of the dual comparator circuit. If both outputs of the dual comparator are high, the probe is not making proper contact with the node under test and a misprobe indication is provided to the user.

DESCRIPTION OF THE PREFERRED EMBODIMENT

Figure 1:
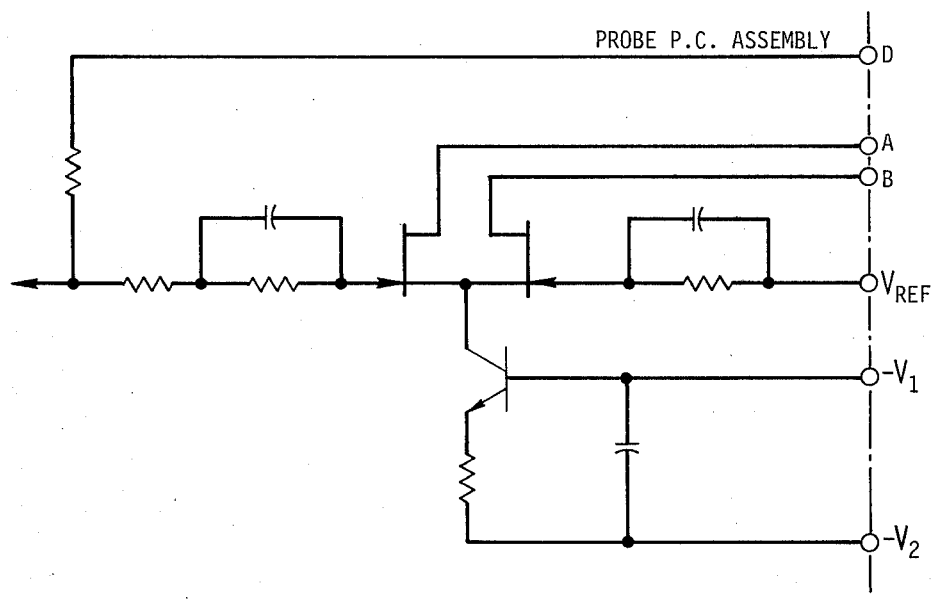
FIG. 1 is a circuit diagram of a digital logic tester probe constructed according to the preferred embodiment of the present invention.
Figure 2:
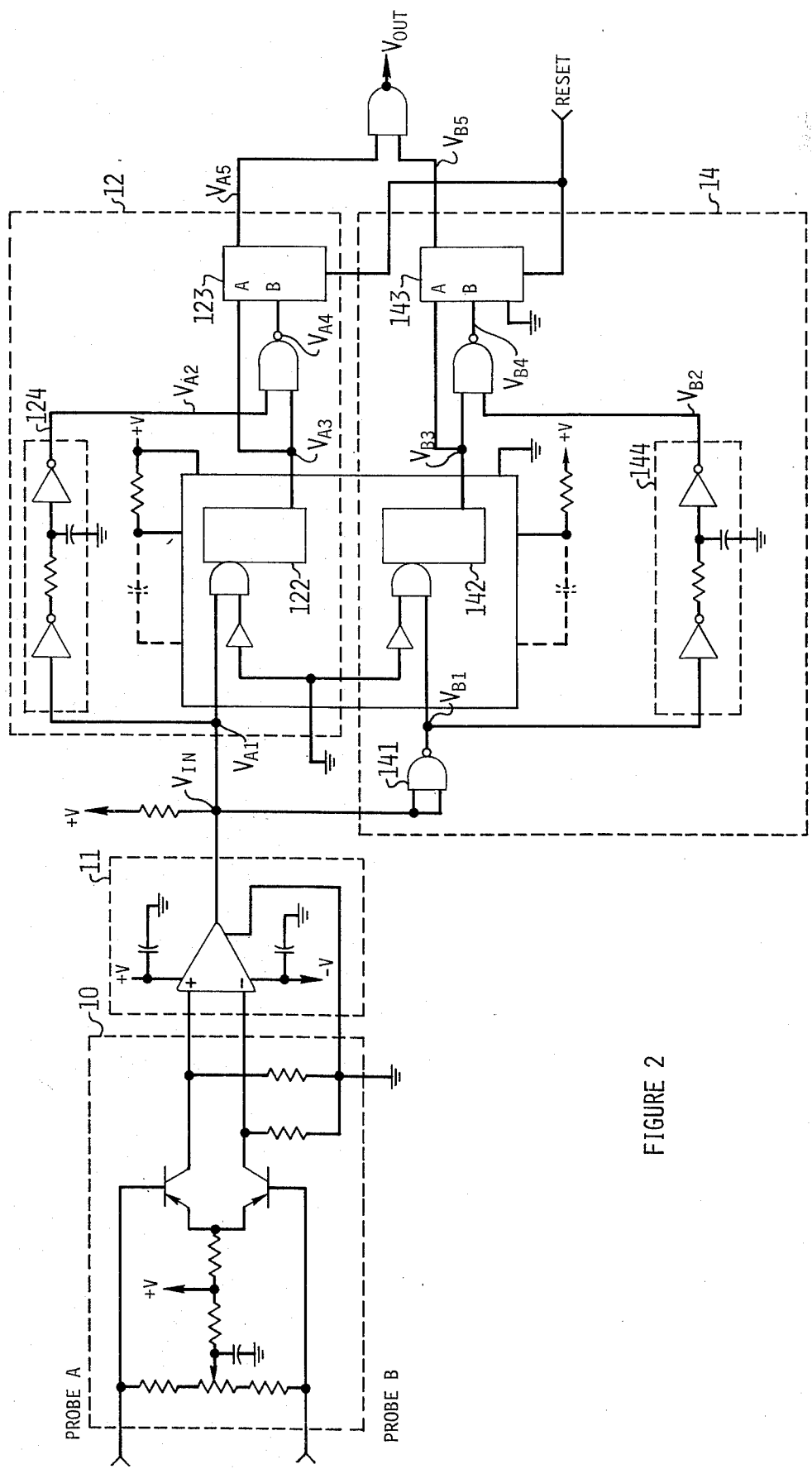
FIG. 2 is a circuit diagram of a pulse discriminator constructed according to the preferred embodiment of the present invention.

Referring to FIG. 1 the probe used to make contact with nodes in the logic circuit under test is a very high input impedance device. Therefore, impedance matching circuitry must be provided in order to facilitate signal processing. Referring now to FIG. 2, the pulse discriminator of the present invention comprises impedance matching circuit 10, which is coupled to signal processing circuits 12 and 14 via comparator 11, and output gate 16. Signal processing circuits 12 and 14 are essentially the same and each receives the same signal for processing from impedance matching circuit 10. Impedance matching circuit 10 also provides voltage level conversion from inputs A and B for interface to comparator 11.

Figure 3:
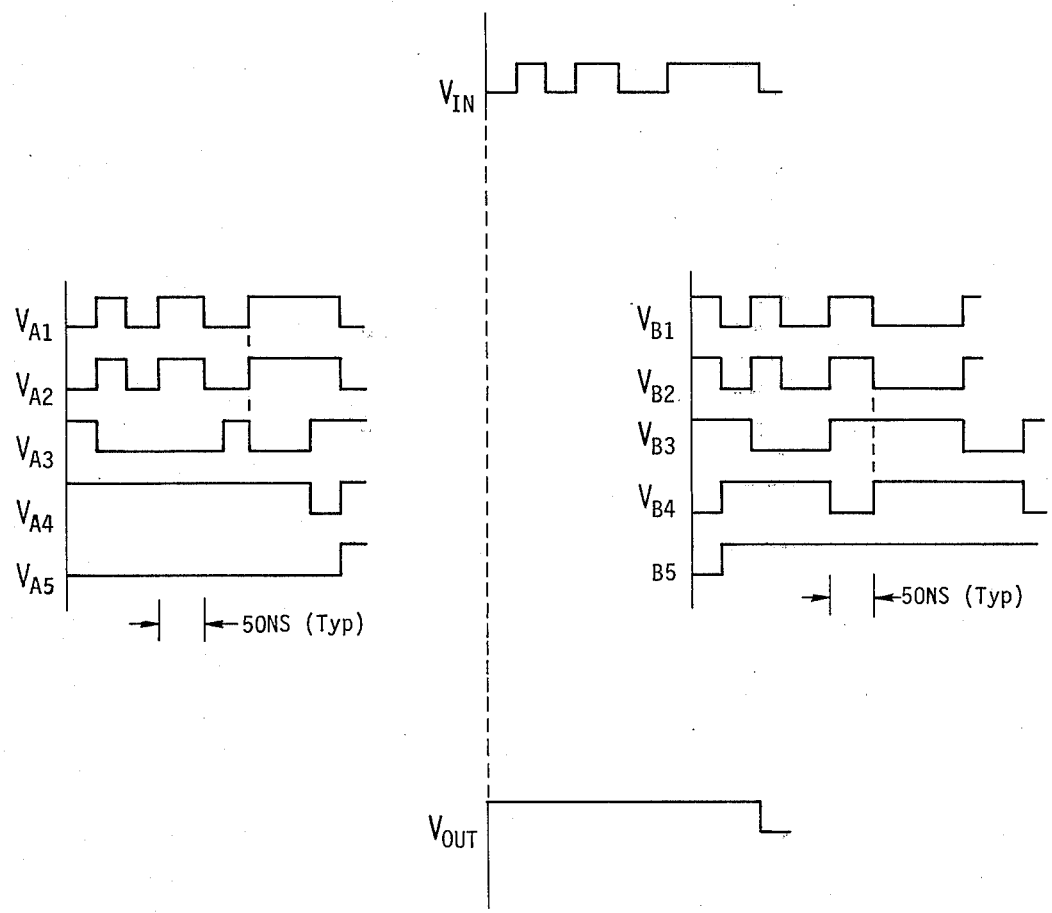
FIG. 3 illustrates signal waveforms at various points in the circuit of FIG. 1.

Signal processing circuit 12 which processes positive-going pulses comprises two paths. Similarly, signal processing circuit 14 which processes negative-going pulses also comprises two paths. One difference between signal processing circuits 12 and 14 is inverter 141 at the input of signal processing circuit 14 for inverting the signal as it is received from the probe tip. Thus, signal $V_{A1}$ is in-phase with the signal detected at the probe tip, while $V_{B1}$ is $V_{A1}$ inverted by inverter 141. One-shot flip-flops 122 and 142 produce a negative pulse of approximately 40 nanoseconds duration in response to the positive-going transition of the input signal which establishes the discrimination time for incoming pulses. Thus, for an incoming pulse of less than about 50 nanoseconds, $V_{OUT}$ will be high. Referring now to FIG. 3, $V_{OUT}$ is high whenever signals $V_{A5}$ and $V_{B5}$ are not coincident or both are low. In order for those signals to be coincident, signals $V_{A3}$ and $V_{B3}$ must be high during the time signal $V_{A4}$ or $V_{B4}$ changes to a high level. In the case of a positive-going pulse input, therefore, signal $V_{A4}$ will not change to a high level unless the pulse width of $V_{IN}$ is greater than about 50 nanoseconds. Thus, noise pulses of less than 50 nanoseconds duration produce no transition of signal $V_{A4}$. Hence, no setting of flip-flop (ff) 123 (signal $V_{A5}$ to a high level) and $V_{OUT}$ will be inhibited and will remain high until a pulse of greater than 50 nanoseconds duration is received.

If a negative-going pulse is received, signal processing circuit 14 responds in the same manner as described for positive-going pulses received by signal processing circuit 12 except that the polarity of that response is reversed by NAND gate 141. Any signal inverter effective for inverting the polarity of the pulse may be used in place of NAND gate 141. The discrimination time is entirely arbitrary. More or less discrimination time can be provided according to the setting of the one-shot and the requirements of a particular application. In the preferred embodiment of this invention, pulses of duration greater than 50 nanoseconds (the duration of the output of one-shots 122 or 142) are acceptable for further analysis by the logic circuit tester. Thus, $V_{OUT}$ switches low, indicating that an acceptable signal has been received.

Summarizing circuit operation with reference to FIG. 2, for a positive-going pulse (referring to the leading edge of the pulse) at $V_{IN}$, signal processing circuit 12 produces signal $V_{A4}$ which is essentially the difference between $V_{IN}$ pulse duration and the duration of the output pulse of one-shot 122, and signal processing circuit 14 produces signal $V_{B4}$ which is substantially the sum of $V_{IN}$ pulse duration and the duration of the output pulse of one-shot 142. Thus, the output of signal processing circuit 14 sets ff 143 (standby) regardless of $V_{IN}$ pulse duration. Conversely, for a negative going pulse at $V_{IN}$, signal processing circuit 12 produces signal $V_{A4}$ which is substantially the sum of $V_{IN}$ pulse duration and the duration of the output pulse of one-shot 122, and signal processing circuit 14 produces signal $V_{B4}$ which is essentially the difference between $V_{IN}$ pulse duration and the duration of the output pulse of one-shot 142. Therefore, in the case of a negative-going pulse, the output of signal processing circuit 12 sets ff 123 (standby) regardless of $V_{IN}$ pulse duration. For either negative or positive going $V_{IN}$ pulses, if the signal processing circuit taking the difference between the $V_{IN}$ pulse and the output pulse of the one-shot is $o$, then $V_{OUT}$ remains high; if that difference is $>o$, $V_{OUT}$ switches low, indicating an "acceptable" pulse. The signal convention for the preferred embodiment of this invention is also arbitrary and can be adapted to the particular application.

The present invention discriminated "acceptable" pulses from "unacceptable" pulses as described above by comparing their duration with the duration of the output of a one-shot which may be set to any arbitrary length. Time delay circuits 124 and 144 compensate for the propagation delay of one-shots 122 and 142, respectively. Typically available one-shots which produce, for example, a 50 nanosecond pulse width, have a variation of on the order of 5 nanoseconds. Thus, some variation in pulse width discrimination will be encountered, proportional to the variation of the one-shot output pulse duration.

Figure 4:
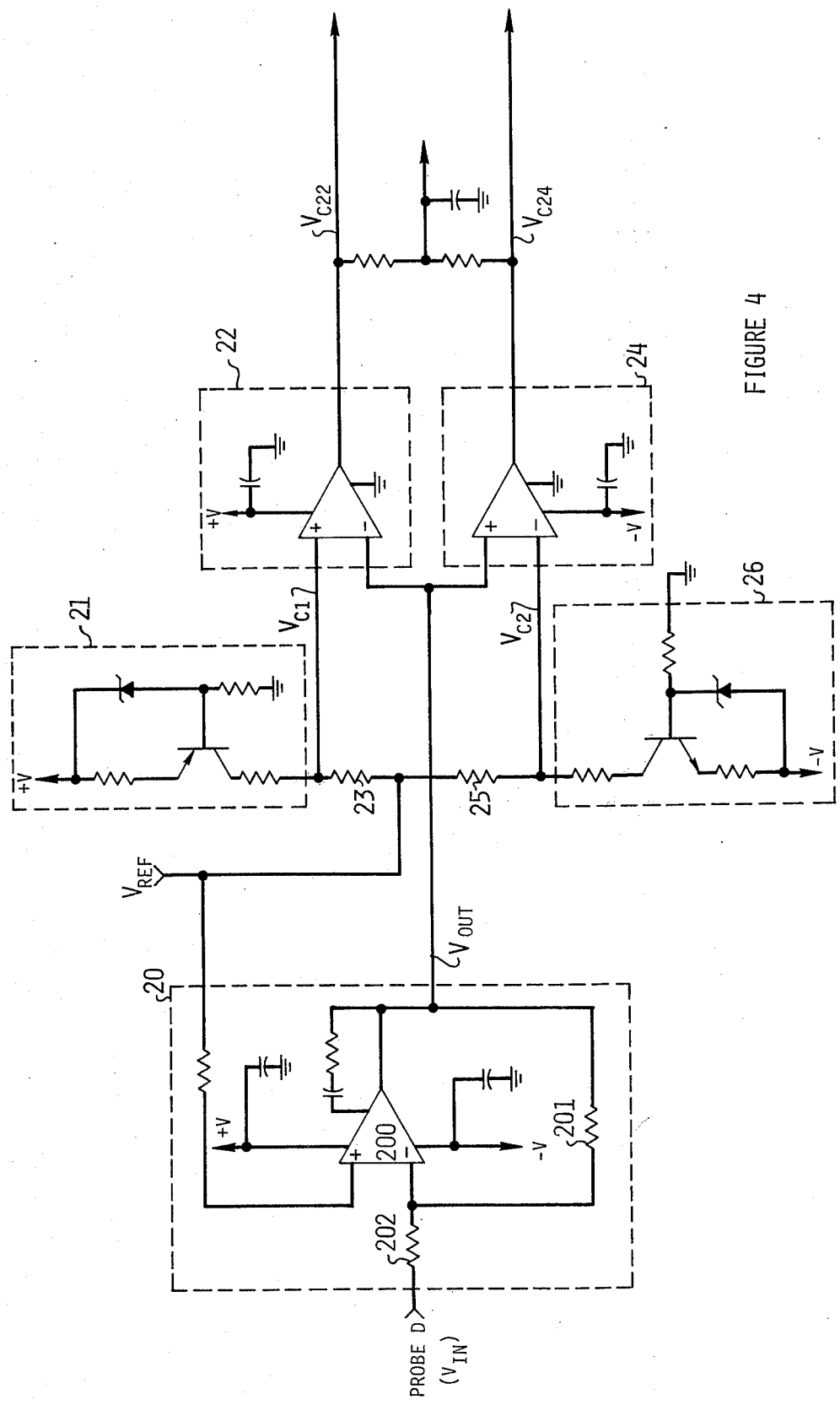
FIG. 4 is a circuit diagram of a probe contact detection system constructed according to the preferred embodiment of the present invention.

The preferred embodiment of the present invention incorporates misprobe detection capability for determining whether adequate electrical contact has been made with the circuit node under test. Referring now to FIG. 4, input circuit 20, which is coupled to comparator circuits 22 and 24, includes amplifier 200 for producing an output voltage in accordance with the relationship $$V_{OUT} = 2V_{REF} - V_{IN} \text{ where } R201 = R202 \text{ and}$$

$V_{REF}$ is an arbitrarily selected reference voltage applied to one input of amplifier 200 and $V_{IN}$ is the voltage at the probe tip. Thus, where the probe tip is not making adequate electrical contact, $$V_{IN} = V_{REF}, \text{ and } V_{OUT} = V_{REF}.$$

Reference voltage $V_{REF}$ is combined with the constant voltage drop across R23, $\Delta e$, to produce reference voltage, $V_{C1}$, which is connected to the positive input of comparator 22.

Thus, $V_{C1} = V_{REF} + \Delta e$.

Since R23 = R25, and the current through these resistors is provided by constant current sources 21 and 26 (the magnitude and polarity of the current being selectable to fit the particular application), $V_{C2} = V_{REF} - \Delta e$, the reference voltage connected to the negative input of comparator 24.

The output of input circuit 20 is coupled to the negative input of comparator 22 and the positive input of comparator 24. The outputs of comparators 22 and 24, $V_{C22}$ and $V_{C24}$, respectively, will both be high for $$V_{IN} = V_{REF} = V_{OUT},$$

since $|V_{C1}| = |V_{C2}|$. $V_{C22}$ will be low and $V_{C24}$ will be high for $$V_{IN} > V_{C1}, \text{ and}$$

$V_{C22}$ will be high and $V_{C24}$ will be low for $$V_{IN} < V_{C2}.$$

Therefore, if the probe tip is not making electrical contact to a source of voltage, the probe input assumes the magnitude of the voltage applied to the positive input of amplifier 200 or $V_{REF}$, and $V_{C22}$ and $V_{C24}$ both remain high. By such sensing of impedance changes at the probe tip, the user may be alerted to inadequate electrical contact by referring to the readout device of the tester.

The logic components employed in the preferred embodiment of the present invention are commonly available gates, flip-flops, amplifiers and inverters. $V_{OUT}$, referring to FIG. 2, and $V_{C22}$ and $V_{C24}$, referring to FIG. 4, are resolved by the computer of the tester system to provide the user an indication of useful test results or lack of adequate electrical contact respectively.

I claim:
1. A logic circuit tester probe system comprising:
 a high input impedance probe for making contact with a logic circuit node under test and producing in-phase signals in response to pulses at that node, said pulses having positive- and negative-going leading edges;
 impedance matching means coupled to the probe for receiving electrical signals therefrom;
 first means coupled to the impedance matching means for producing first signals in response to pulses having positive-going leading edges when the duration of the pulse is greater than a preselected value, and for producing first standby signals in response to pulses having negative-going leading edges;

second means coupled to the impedance matching means for producing second signals in response to pulses having negative-going leading edges when the duration of the pulse is greater than the preselected value, and for producing second standby signals in response to pulses having positive-going leading edges; and output means coupled to the first and second means for rejecting pulses detected at the node having a duration less than the preselected value in response to the combination of the first signals and second standby signals or the second signals and the first standby signals.

2. A logic circuit tester probe system as in claim 1 wherein:
the first means includes a first one-shot;
the first signals have a duration approximately equal to the difference between the positive-going pulses detected at the circuit node and the duration of the output pulses of the first one-shot;
the second means includes a second one-shot; and
the second standby signals have a duration approximately equal to the sum of the duration of the positive-going pulses detected at the circuit node and the duration of the output pulses of the second one-shot.

3. A logic circuit tester probe system as in claim 1 wherein the preselected value is approximately 50 nanoseconds.

4. A logic circuit tester probe system as in claim 1 wherein:
the first standby signals have a duration approximately equal to the sum of the duration of the negative-going pulses detected at the circuit node and the duration of the output pulses of the first one-shot; and
the second signals have a duration approximately equal to the difference between the duration of the negative-going pulses detected at the circuit node and the duration of the negative pulses of the second one-shot.

5. A logic circuit tester probe system as in claim 1 further including misprobe detection means for determining whether the probe tip has made electrical contact with the circuit node under test, said detection means comprising:
reference means coupled to the probe for providing a first reference voltage at the probe tip and for producing output signals in response to signals received at the probe tip;
first comparator means having first and second inputs, of opposite phase relative to each other, said first input being coupled to a second reference voltage, and said second input being coupled to the reference means for producing an output signal at the output in response to an open circuit at the probe tip; and
second comparator means having first and second inputs of opposite phase relative to each other, said first input being coupled to a third reference voltage and said second input being coupled to the reference means for producing an output signal in response to an open circuit at the probe tip;
the relative phase of the output signals of the first and second comparator means being effective for indicating whether the probe tip has made electrical contact with the circuit node under test.

6. A logic circuit tester probe system as in claim 5 wherein the relative phase of the output signals of the first and the second comparator means is the same.

7. A logic circuit tester probe system as in claim 6 wherein the output signals of the first and second comparator means are both high level signals.

8. A logic circuit tester probe system as in claim 5 wherein the output signals of the first and second comparator means have first and second levels; and
the first comparator means produces a first level output signal and the second comparator means produces a second level output signal in response to a voltage at the probe tip greater than the reference voltage.

9. A logic circuit tester probe system as in claim 8 wherein the first comparator means produces a second level output signal and the second comparator means produces a first level output signal in response to a voltage at the probe tip less than the first reference voltage.

10. A logic circuit tester probe system as in claim 9 wherein the first level of the output signal of the first and second comparator means is lower than the second level thereof.

11. A logic circuit tester probe system comprising:
a high input impedance probe for making contact with a logic circuit node under test and producing in-phase signals in response to pulses detected at that node, said pulses having positive- and negative-going leading edges;
impedance matching means coupled to the probe for receiving electrical signals therefrom;
first means including a first one-shot coupled to the impedance matching means for producing first signals in response to pulses having positive-going leading edges, said first signals having a duration approximately equal to the difference between the duration of the positive-going pulses detected at the circuit node and the duration of output pulses of the first one-shot, and for producing first standby signals in response to pulses having negative-going leading edges;
second means including a second one-shot coupled to the impedance matching means for producing second standby signals in response to pulses having postive-going leading edges, said second standby signals having a duration approximately equal to the sum of the duration of the positive-going pulses detected at the circuit node and the duration of the output pulses of the second one-shot, and for producing second signals in response to pulses having negative-going leading edges; and
output means coupled to the first and second means for rejecting all pulses detected at the node having a duration less than the duration of the first signal in response to the combination of the first signals and the second standby signals or the second signals and the first standby signals.

12. A logic circuit tester probe system as in claim 11 wherein:
the first standby signals have a duration approximately equal to the sum of the duration of the negative-going pulses detected at the circuit node and the duration of the output pulses of the first one-shot; and
the second signals have a duration approximately equal to the difference between the duration of the negative-going pulses detected at the circuit node and the duration of the output pulses of the second one-shot.

* * * * *

UNITED STATES PATENT AND TRADEMARK OFFICE
CERTIFICATE OF CORRECTION

PATENT NO. : 4,016,492

DATED : April 5, 1977

INVENTOR(S) : Edward C. Miller, Jr et al.

It is certified that error appears in the above—identified patent and that said Letters Patent are hereby corrected as shown below:

Column 3, line 42, before "0", first occurrence, insert -- $\leq$ --.

Signed and Sealed this

Seventh Day of June 1977

[SEAL]

Attest:

RUTH C. MASON
*Attesting Officer*

C. MARSHALL DANN
*Commissioner of Patents and Trademarks*